United States Patent
McCosh (10) Patent No.: US 7,135,873 B2
(45) Date of Patent: Nov. 14, 2006

(54) DIGITAL TIME DOMAIN REFLECTOMETER SYSTEM

(75) Inventor: John C. McCosh, San Diego, CA (US)

(73) Assignee: Psibor Date Systems, Inc., San Diego, CA (US)

( * ) Notice: Subject to any disclaimer, the term of this patent is extended or adjusted under 35 U.S.C. 154(b) by 0 days.

(21) Appl. No.: 10/656,032

(22) Filed: Sep. 5, 2003

(65) Prior Publication Data
US 2005/0052190 A1    Mar. 10, 2005

(51) Int. Cl.
G01R 31/02    (2006.01)
G01R 31/11    (2006.01)
G01R 27/32    (2006.01)

(52) U.S. Cl. ......................... 324/644; 324/533; 324/543

(58) Field of Classification Search ................ 324/533, 324/512, 523, 532, 534, 543, 539, 644
See application file for complete search history.

(56) References Cited

U.S. PATENT DOCUMENTS 4,970,466 A * 11/1990 Bolles et al. ................ 324/533
5,440,528 A * 8/1995 Walsh ......................... 324/533
6,075,833 A * 6/2000 Leshay et al. ................ 377/16
6,285,195 B1 * 9/2001 Needle ........................ 324/534

* cited by examiner

Primary Examiner—Vincent Q. Nguyen
Assistant Examiner—John Teresinski (57) ABSTRACT

A digital time domain reflectometer system is provided for performing a measurement process that is useful for calculating a cable length. The measurement process starts with a launch controller periodically generating a sync signal for turning a duration signal on. After a known delay time, the launch controller launches a signal on a cable, and if a reflected signal is detected, a detection circuit turns the duration signal off. A counter counts the number of clock pulses in the duration signal. This system is made more accurate by performing the measurement process multiple times and averaging the results. Using the averaged results, and compensating for the added known delay time, the cable length is calculated. An adaptive threshold may be used to enhance measurement accuracy.

19 Claims, 11 Drawing Sheets

DIGITAL TIME DOMAIN REFLECTOMETER SYSTEM

BACKGROUND

The field of the present invention is electronic test instruments. More particularly, the present invention relates to devices for measuring a cable length using a time domain reflectometry system.

When installing or maintaining a cable system, it is often desirable to measure the length of a cable. For example, an installer may desire to know how many feet of cable are left in a spool of wire. By knowing the length of cable on the spool, the operator may select a length of cable to install that does not have unnecessary splices. In another example, a repairperson may desire to locate a physical fault in a cable. Often times cables are buried underground or hidden within walls, so it is highly desirable to locate the physical disruption in the cable so that demolition and construction damage may be minimized. Further, by accurately locating the fault, the fault may more quickly be found and communication or other service be returned more promptly. It will be appreciated that a fault may be a break, a short, or other disruption to a cable system.

Cable length is often determined using a device called a time domain reflectometer (TDR). A time domain reflectometer is typically configured as a portable hand held device which may be conveniently coupled to one end of a cable. An operator configures the TDR to the parameters of the cable type being measured, and couples the TDR to the cable. Once connected, the time domain reflectometer initiates a measurement cycle by sending a signal pulse onto the cable. When the pulse reaches the end of the cable or a disruption on the cable, the pulse bounces off the end or disruption and is received back at the TDR. The time duration that it took the pulse to travel from the TDR to the end of the cable and from the end of the cable back to the TDR is indicative of the cable length.

A signal traveling on a cable travels at a speed that is a factor of the speed of light in a vacuum. This factor may be different for different cables, and is called the NVP (velocity of propagation). The NVP is typically about 0.7, but depending on cable type they vary between about 0.4 and about 0.9. In this regard the TDR may be calibrated for a particular NVP, and the round trip duration time for the pulse may be used to indicate the cable length.

Many TDRs are analog devices which display a cable length on an analog meter. These analog TDRs give a general indication of cable length, but typically do not have accuracy sufficient to narrowly identify a disruption in the cable or accurately present a cable length. Further, the analog devices are subject to variations due to temperatures and environment, and are subject to degraded performance over time.

It would be desirable to have a digital TDR that could avoid many of the problems present in an analog device. However, known digital TDRs do not provide sufficient accuracy, and typically are only accurate to within about 3 to 4 feet. Although this is more accurate than the typical analog device, it would still be highly desirable to locate disruptions and cable lengths more narrowly. For example, it may be highly desirable to have a digital TDR that could find a disruption to within less than one-foot resolution. In designing such a digital tool, it would be useful for the hypothetical digital TDR to operate on NVPs ranging from about 0.40 to about 0.90, and be able to measure lengths ranging from less than one foot to greater than 3,000 feet with a less than 1-foot resolution. At one extreme, when measuring a 3,000 foot cable at 0.4 NVP with such a hypothetical TDR, the time delay would be in excess of 15 microseconds. At the other extreme when at 1 foot and 0.99 NVP, the time delay would be around 2 nanoseconds. Accordingly, a hypothetical TDR designed to meet these specifications would need to measure duration periods ranging about 2 nanoseconds to greater than 15 microseconds with a time resolution of less than 50 picoseconds. Converting these requirements into a component structure would mean that such a hypothetical device may require a up to 19 bit counter operating at about 20 gigahertz. A digital TDR incorporating such a device, even if available, would be too expensive and draw too much power for current applications.

TDRs also suffer from a problem known as the dead zone problem. The dead zone problem relates to the shortest time delay that the TDR can measure. Typical dead zones for known TDRs are in the range of 10–20 nanoseconds which corresponds to about 3 to 6 feet of cable. If the cable has a disruption in this dead zone then the TDR will not report the disruption, or may report the disruption as being in a different location. It would be highly desirable to have a TDR that could report all the disruptions on the cable including those within a few feet of the TDR.

Accordingly there exists a need for a digital TDR that is accurate, able to measure short cable lengths and is easy and economical to build.

SUMMARY

Briefly, the present invention provides a digital time domain reflectometer system performing a measurement process that is useful for calculating a cable length. The measurement process starts with a launch controller periodically generating a sync signal for turning a duration signal on. After a known delay time, the launch controller launches a signal on a cable, and if a reflected signal is detected, a detection circuit turns the duration signal off. A counter counts the number of clock pulses in the duration signal. This system is made more accurate by performing the measurement process multiple times and averaging the results. Using the averaged results, and compensating for the added known delay time, the cable length is calculated. An adaptive threshold may be used to enhance measurement accuracy.

In a preferred example of the digital time domain reflectometer (TDR), the TDR uses a simple 8-bit counter, 8-bit processor, and a 10 MHz clock to make the accurate length calculations. These commodity-level components are able to provide such high accuracy as the TDR measurement is performed thousands of times, and the results averaged. Accordingly, accuracy can be improved by increasing the number of measurements. In one example of the digital TDR, the measurement is performed about every 40 microseconds, or about 25,000 times per second. In an improvement to the standard counter, an 8-bit modified Gray code counter may be used. The modified Grey allows a one-bit transition for 15 increments, and then the $16^{th}$ increment has a 2-bit transition. Even so, the effects of multi-bit transitions may be substantially reduced, without incurring any substantial design penalties.

Advantageously, the disclosed TDR system provides superior accuracy over a wide cable length. For example, the TDR has better than 1 foot resolution over a range extending to about 3000 feet. Of course, this resolutions and range may be adjusted with minor modifications to the illustrated designs. Further, the disclosed TDR has substantially reduced dead-zone effects, so is enabled to perform accurately even on short cable lengths. The disclosed TDR is also economical to construct, since it uses readily available and relatively low cost components. For example, the digital TDR uses a simple 8-bit counter, 8-bit processor, and a 10 MHz clock in making the highly accurate length calculations. Each of these components is widely available and low cost.

These and other advantages will become apparent by review of the figures and detail descriptions that follow.

DETAILED DESCRIPTION

Figure 1:
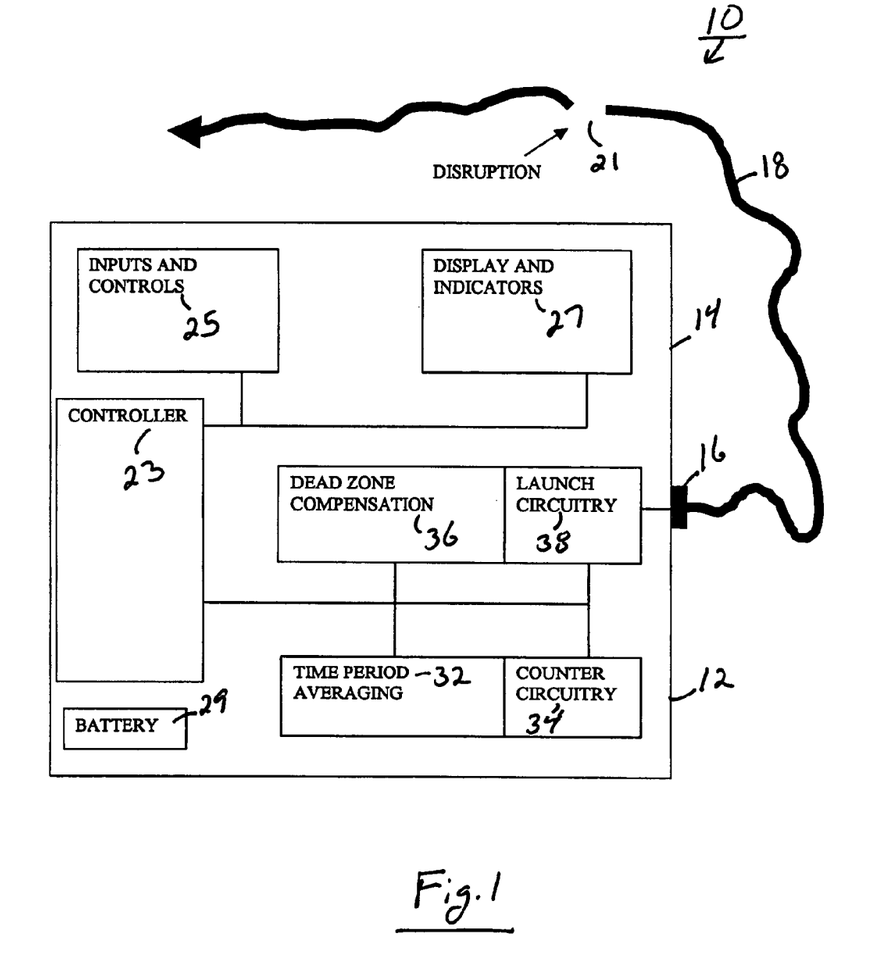
FIG. 1 is a block diagram of a time domain reflectometer system in accordance with the present invention.

Referring now to FIG. 1 a time domain reflectometer is illustrated. Time domain reflectometer is designed to actively measure the length of a cable. More particularly, the time domain reflectometer 10 may be used for finding the end of a cable, a break in a cable, or a short in a cable. It will be appreciated that the cable may be for example, a coaxial cable, a twisted pair cable, or another type of cable useful for transmission of information or data signals. In another use, the time domain reflectometer 10 may be useful for detecting lengths, breaks, and shorts in electrical and control cabling. It will be appreciated that minor modifications to the time domain reflectometer 10 may enable the device to be used on many different types of cabling systems.

The time domain reflectometer 10 generally comprises a time domain unit 12, which has a connector 16 for connecting to a cable 18. In one example, cable 18 has a disruption 21 an unknown distance from the connector 16. The disruption 21 could be for example, the end of the cable, a short in the cable, or a break in the cable. It may be highly desirable to accurately locate the disruption 21, for example, for purposes of finding the fault in the cable 18. By accurately locating the fault, resulting demolition, construction costs, and time may be minimized in finding and making a necessary repair. In another example, accurately finding the disruption 21 would allow an operator to accurately determine how much cable is left on the cable reel. In this way, lengths of cable may be selected for running a particular distance without unnecessary splicing.

In one example of the time domain unit 12, the time domain unit 12 is portable. Therefore, a battery 29 may be provided inside the housing 14 for providing portable power. It will be appreciated that other types of energy sources could be used depending on specific applications. For example, a power supply may be coupled to the power grid or a car battery. Additionally, a solar power system could be utilized. A controller 23 is used to provide control functions and processing power for operating the digital domain reflectometer 10. It will be appreciated that the controller could be for example, a microprocessor, microcontroller, DSP processor, a PLD, a gate array, or discreet logic. The time domain unit 12 may also have input devices or controls 25 for allowing operator input and control. For example, an operator may use a rotary knob or keypad to specify a particular type of cable under test. Since each cable may have a different velocity of propagation, it may be useful to allow the user to select or input the velocity of propagation factor. In another example, the time domain unit may have multiple ranges, with each range having a different accuracy. For example, the operator may set the device to measure relatively short lengths at a higher accuracy, and set to a different range to measure longer lengths at a somewhat reduced accuracy. It will be appreciated that many other inputs and controls may be provided on the time domain reflectometer 10.

The time domain reflectometer 10 may also contain operator displays and indicators 27. For example, the time domain reflectometer may contain a digital display for displaying the cable length in feet, meters, or other appropriate scale. In another example, the time domain unit 12 may have an audible speaker for providing an audible alert regarding a cable condition. For example, an audible warning could warn an electrician that an electrical cable has a short. It will be appreciated that other visual and non-visual displays and indicators may be provided. The controller also cooperates with a time period averaging function 32 and counter circuitry 34 for providing a highly accurate length measurement. Further, controller 23 cooperates with a dead zone compensation function 36 and launch circuitry 38 for substantially eliminating the traditional problems associated with reflectometer dead zones.

Advantageously, the time domain reflectometer 10 provides superior accuracy in making length measurements as compared to known analog and digital time domain reflectometers. For example, the time domain reflectometer 10 may be accurate to within a resolution of less than one foot, and be able to accurately determined cable lengths out to over 3000 feet. Additionally, the time domain reflectometer 10 eliminates the disadvantages of the traditional reflectometer dead zone, allowing the time domain reflectometer 10 to remain accurate even at short cable lengths. Time domain reflectometer 10 is able to provide this high level of accuracy and eliminate the dead zone problems while enabling the use of relatively low resolution counters, low frequency oscillators, and low frequency processors. For example, the time domain reflectometer 10 maybe constructed using a simple 8-bit counter, an 8-bit processor, and an oscillator operating at 10 MHz. Such parts are readily available and relatively inexpensive. It will be appreciated that other components may be substituted consistent with this disclosure.

Figure 2:
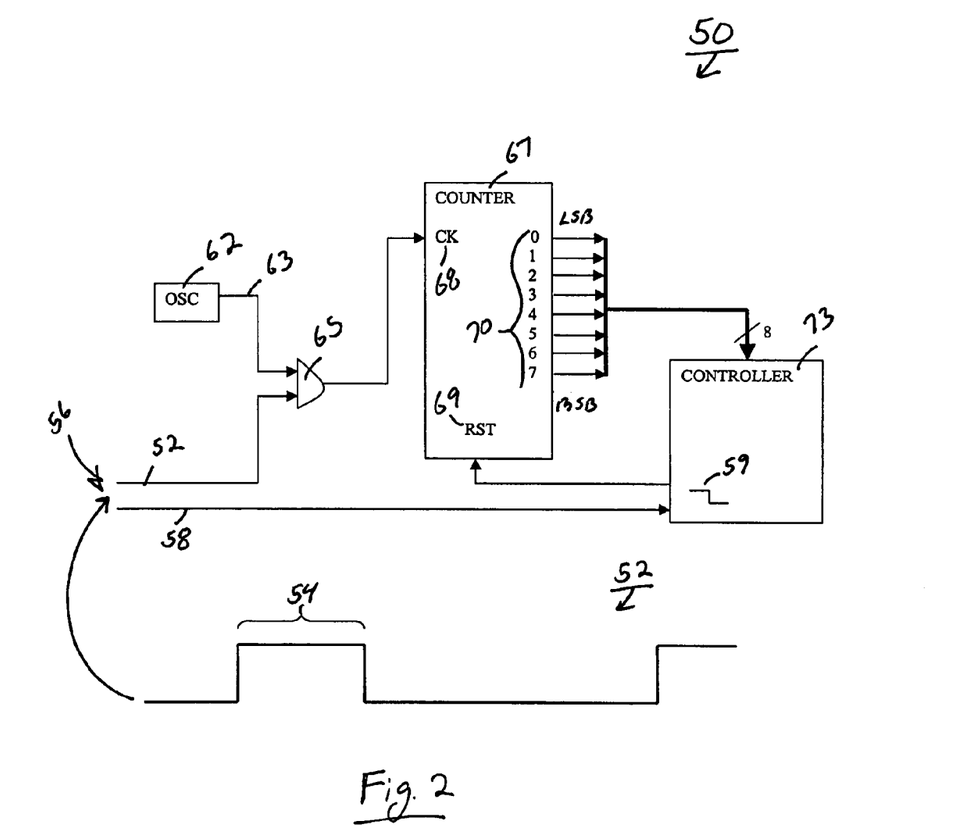
FIG. 2 is a block diagram of an enhanced-resolution counter in accordance with the present invention.

With the general time domain reflectometer 10 described, individual aspects will now be discussed in greater detail. Referring now to FIG. 2 an enhanced resolution counter 50 is shown. The enhanced resolution counter 50 is arranged to receive signal 56 from the measurement circuitry of the time domain reflectometer. One of the signals 56 is a duration signal 52. The duration signal 52 has individual pulses having a duration 54. The duration 54 is indicative of a cable length measured by the time domain reflectometer. Accordingly, the more accurately the duration 54 may be measured the more accurately the cable length may be determined. The time domain measurement circuitry also provides a launch signal 58. The launch signal 58 provides an indication as to when a particular measurement cycle has ended. For example, launch signal 58 may remain in an on state while a length measurement is being taken by the time domain measurement circuitry, and may transition to a lower state then the measurement cycle is complete. In this way, a trailing edge 59 on the launch signal will indicate to controller 73 that a particular measurement process has been completed. In this way, the controller 73 may send a reset signal to a reset port 69 on counter 67. By resetting the counter, the counter bits 70 would be reset to an initial state, and the counter 67 would be ready to count for the next measurement cycle.

The duration signal 52 is shown in an off state when the duration signal is not present, and shown in an on state when the duration signal is present. The duration signal is received into an AND gate 65. The other input to the AND gate is received from an oscillator 62. The oscillator 62, provides a reference signal 63 generally in the shape of a clock pulse train. The pulse train may operate for example, at approximately 10 MHz. It will be appreciated that other frequencies may be used for application specific needs. However, it has been found that 10 MHz provides superior accuracy while enabling the use of relatively inexpensive components. The reference signal 63 and the duration signal 52 are anded together in the AND gate 65, and the resulting signal is applied to the clock input of counter 67. In this way, the counter 67 counts the number of 10 MHz pulses occurring within duration 54. Once the launch signal 58 indicates that a particular measurement has been made, the controller reads the count 70 from the counter 67, and then resets the counter for the next measurement.

It will be appreciated that an 8 bit counter using a 10 MHz counting resolution does not provide sufficient accuracy on any single measurement. Accordingly, making many such low-resolution measurements and averaging the results to obtain a highly accurate average measurement increase accuracy. It will also be appreciated that the number of measurements may be increased to further increase accuracy of the length. In practice, it has been found that making many thousands of these low-resolution measurements and averaging the results provides a resolution of less than one foot of cable length. Running more measurements may further enhance resolution, although the test time would increase. Further, it will be appreciated that test time could be reduced if less accuracy was acceptable for some applications. It will also be appreciated that the overall accuracy of the time domain reflectometer is affected by the synchronization relationship between oscillator 62 and any reference signal used toward the generation of the duration signal 52. Preferably, the oscillator 62 provides a reference signal 63 that is unrelated to the reference signal used to drive the duration signal 52.

In selecting the specific components for the enhanced resolution counter 50, several technical considerations were taken into account. First, an 8-bit counter was selected, as 8-bit counters are readily available and relatively inexpensive. Since 8-bit counter provides a maximum of 256 counts, it is required that the counter not overflow during the expected duration of the duration signal 52. Assuming a 3000 feet long cable at 0.40 NVP, the duration signal would have an expected duration of approximately 15 microseconds. Using a 256 length counter, the reference clock frequency must be set below about 17 MHz. To provide substantial design margin and because of their ready availability and low price, a 10 MHz oscillator 62 was selected. It will be appreciated that other bit-lengths of counters and other oscillator frequencies may be used consistent with this disclosure. With these parameters set, it can be seen that a new measurement cycle could be made about every 40 microseconds. At this rate, approximately 25,000 measurements could be made in one second. Accordingly, it can be seen that several thousand measurements can be made readily by an operator in a short period of time. In this way, a highly accurate averaged result may be obtained using relatively low resolution and cost effect measurement circuitry.

Figure 3:
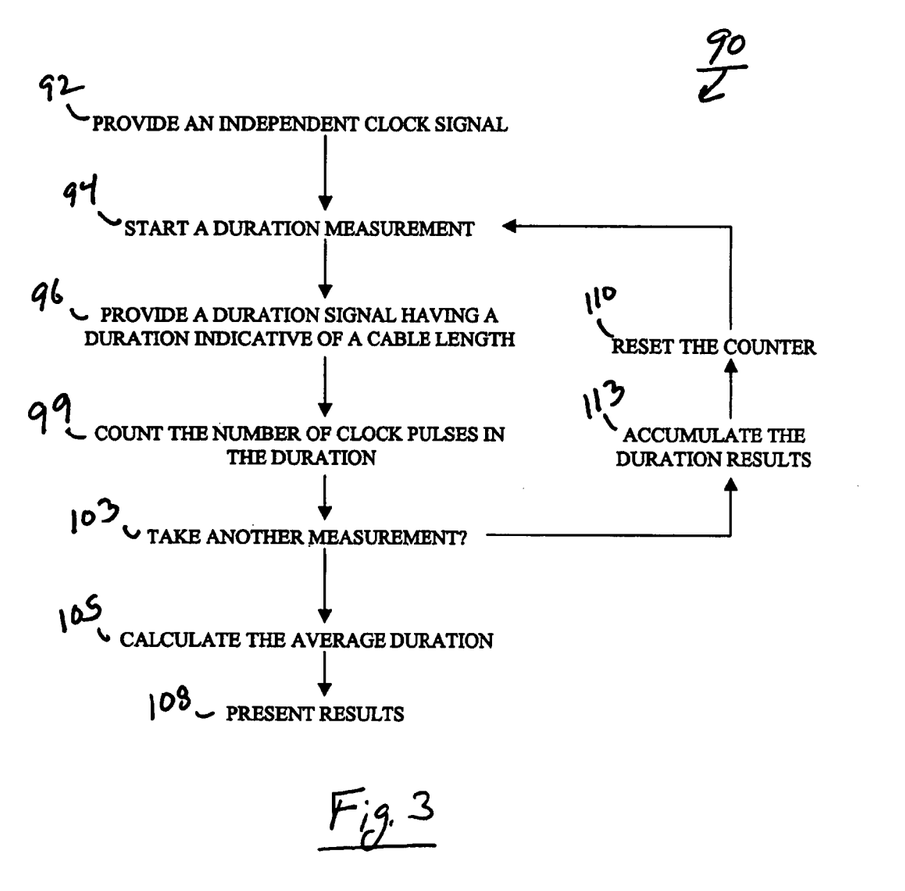
FIG. 3 is a flowchart of a method of enhancing a counter resolution in accordance with the present invention.

Referring now to FIG. 3 a method 90 for enhanced counter resolution will be described. In block 92 and independent clock signal is provided. The clock signal 92 should be independent from the clock reference signal used to drive a launch pulse into the cable under test. Once the signal has been launch into the cable under test, a duration measurement is started 94. Once the pulse is reflected in the cable and received at the time domain reflectometer, a duration signal is generated with the duration signal having a duration indicative of the cable length 96. More specifically, the duration is related to the round trip time from the TDR to the end to the cable and back to the TDR, so the duration indicates the round-trip distance. For each measurement cycle, the counter is used to count the number of clock pulses in the duration 99 with the results from each measurement cycle being accumulated 113. As described earlier, it is preferable that thousands of low-resolution measurements be taken. Accordingly, in block 103 the process will repeat, typically for thousands of cycles before calculating the average duration 105 and presenting the results 108. Each time a measurement is taken, the results are accumulated 113 and the counter is reset 110 prior to the start of the next measurement 94.

Figure 4:
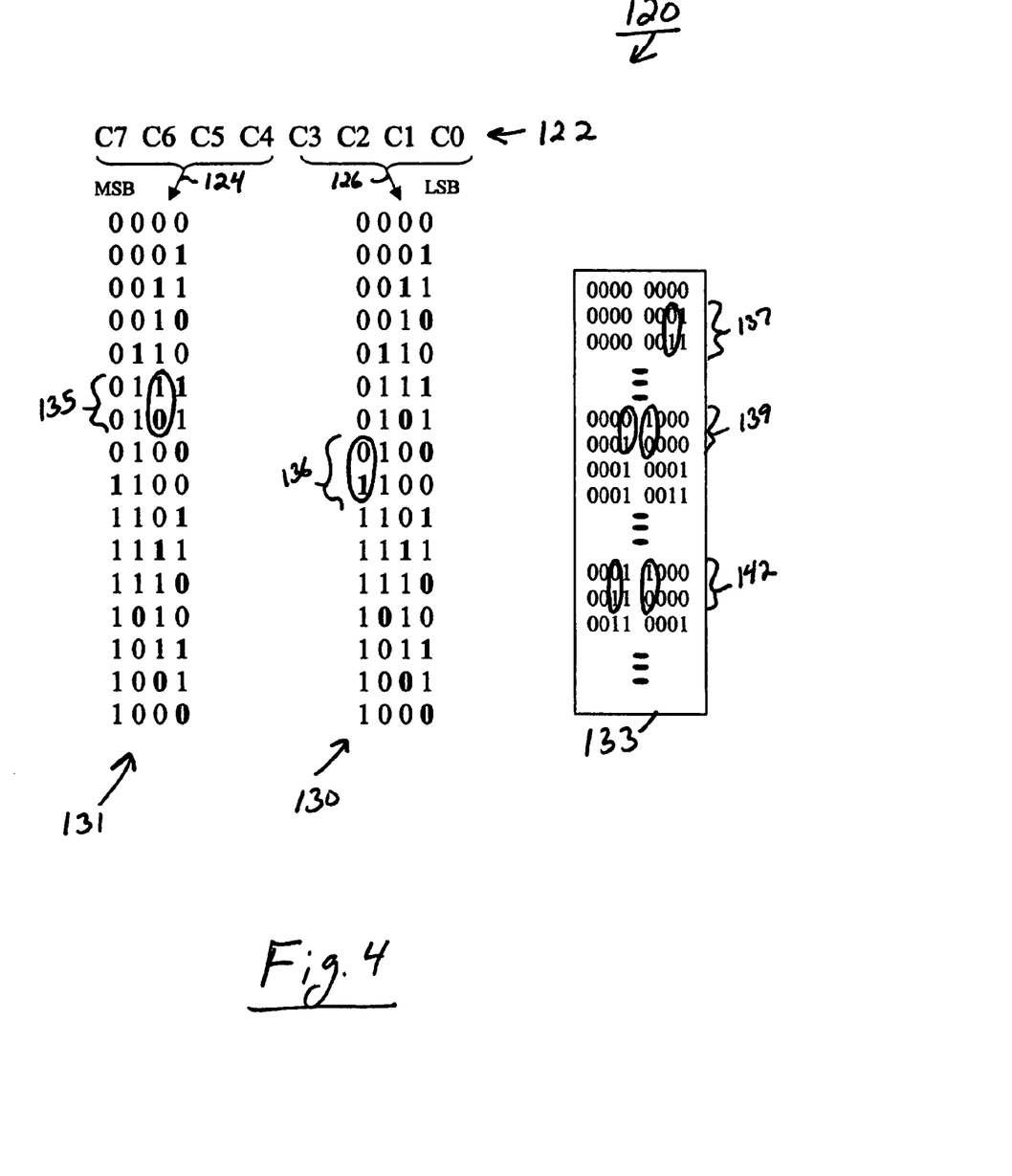
FIG. 4 is an illustration of a modified Gray code in accordance with the present invention.

Referring now to FIG. 4 an improved counter transition 120 will be discussed. A traditional 8-bit counter counts from 0 to 255 in single bit increments. The single bit increments follow the traditional increments in the binary number system. However, it has been found that such counting may lead to certain non-linearities and inaccuracies in making an individual measurement. These non-linearities and inaccuracies are related to major bit transition cycles in the binary counter system. For example, the transition from binary 7 to binary 8 requires that four bits transition simultaneously. Similar major bit transitions occur between binary 15 to binary 16, binary 63 to binary 64 and so on. At successively higher transition points, even more bits may change states at the same time. When large numbers of bits change state at the same time, large power supply current flows which could disrupt other circuitry in the time domain reflectometer. It is known to use an 8-bit Gray code to reduce the problems associated with major bit transitions. An 8-bit Gray code is structured such that each increment of the counter only changes one bit in the code. By only changing one bit, the disturbances due to major bit transitions are eliminated.

Unfortunately, implementing an 8-bit Gray code is very inefficient in terms of the amount of logic required to implement the counter. For example, a standard 8-bit binary counter may be implemented with a programmable logic device using only 8 logic cells. A similar function 8-bit Gray counter may require up to 26 logic cells to implement. Thus, the 8-bit Gray code counter requires over 3 times the logic cells as a standard 8-bit counter. Although implementing an 8-bit Gray code would reduce major bit transition effects, it adds additional complexity and cost to the time domain reflectometer.

As a compromise between the Gray code and the standard binary code, the counter transition 120 provides an improved Gray code increment process. The counter transition 120 has an 8-bit counter 122. The counter 122 is divided into a lower 4-bits 126 and an upper 4-bits 124. The lower 4-bits 126 correspond to one 4-bit Gray code 130 while the upper 4-bits 124 correspond to another 4-bit Gray code 131. Each of the 4-bit Gray codes 130 and 131 are a traditional Gray code in that each transition has only a 1-bit change. For example, transitions 135 and 136 are shown having only a 1-bit change. In the counter transition 120, the use of two adjacent 4-bit Gray codes enables 1-bit transition for 15 increments and a single 2-bit transition on the $16^{th}$ increment, with this process repeating. For example, the example progression 133 shows 1-bit changes at location 137. However, every $16^{th}$ count requires a 2-bit change 139 and 142. Accordingly, the counter system 122 eliminates most of the effects of major bit transitions, and when a multiple bit transition does occur it is limited to a 2-bit transition. Advantageously, the counter as described in FIG. 4 may be implemented using only 8 logic cells, so enabled most of the benefit of using a Gray code, without any logic cell design penalty.

Figure 5:
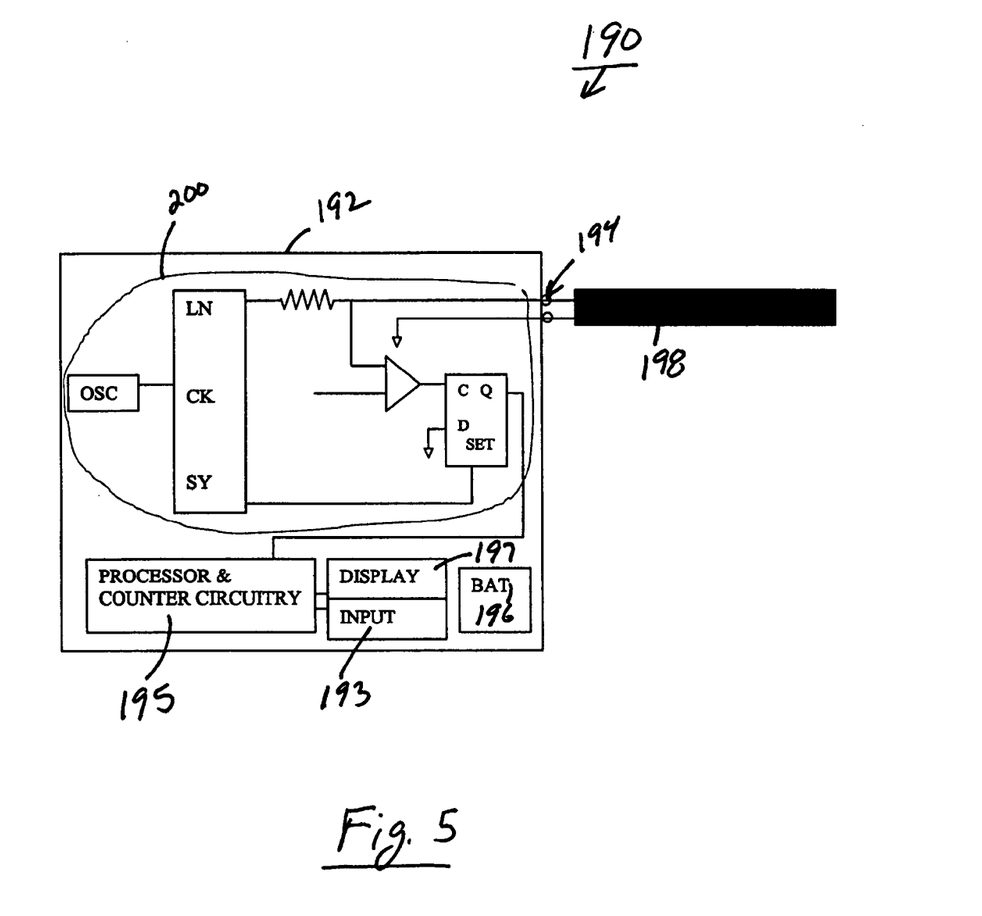
FIG. 5 is a block diagram of a launch assembly in accordance with the present invention.

Referring now to FIG. 5, a launch assembly 190 is illustrated. Launch assembly 190 includes a housing 192 having a connector 194. The connector 194 is useful for connecting to a cable 198. In particular, the launch assembly 190 has launch circuit 200 for injecting a launch pulse into cable 198. If the launch pulse bounces off the far end of the cable and the launch pulse returns on cable 198, the processor and counter circuitry 195 may determine the round trip time for the pulse, and thereby calculate a cable length. As described above, it will be appreciated that the determined cable length may be the overall length of the cable, the distance to a short in the cable, or the distance to the break in the cable. The processor and counter circuitry cooperate with a display and user controls for interacting with an operator. In one example in the launch assembly 190, the launch assembly is included in the portable device, and therefore a battery 196, user input controls 193, and a display device 197 may be useful.

Figure 6:
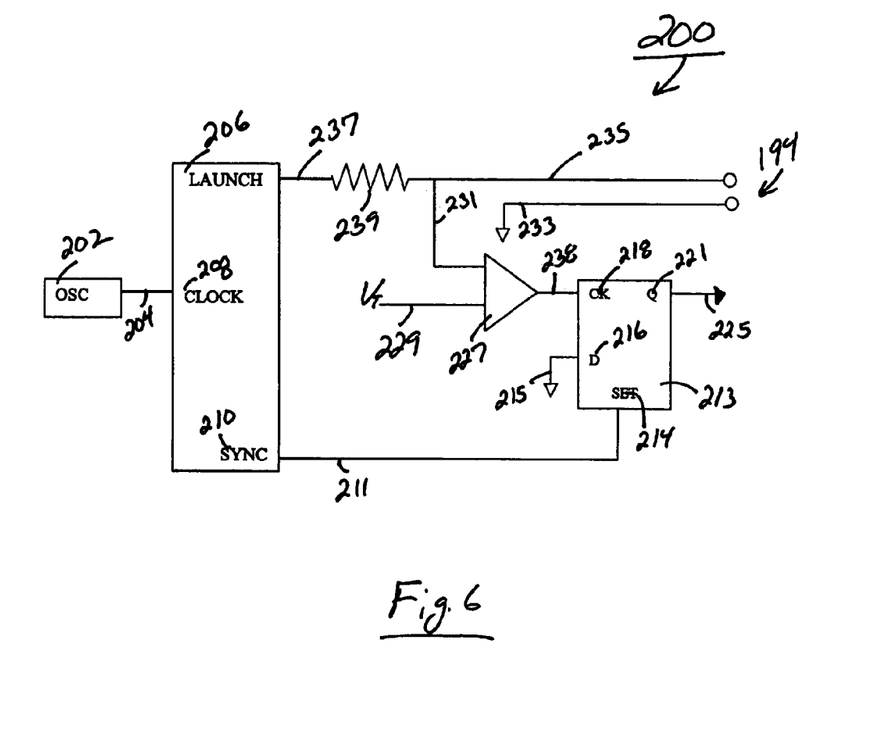
FIG. 6 is a block diagram of a launch circuit in accordance with the present invention.

Referring now to FIG. 6, the launch circuit 200 will be described in more detail. The launch circuit 200 includes an oscillator 202 providing a reference signal 204. The reference signal 204 is accepted at a clock input at the launch controller 206. The launch controller may be a microprocessor, a digital state machine, a gate array, or a programmable logic device, for example. It will be appreciated that other physical embodiments of the launch controller may be used. The particular frequency used for the oscillator 202 may be adjusted for application specific needs, but it has been found that a relatively slow oscillator, around 400 KHz, is sufficient for launch circuit 200. If the launch circuit 200 is used in conjunction with the enhanced resolution counter 50 described earlier, it is desirable that the oscillator 202 be selected at a frequency unrelated to the frequency of the oscillator used in the counter circuit.

When a new measurement is to be taken, the launch controller 206 generates a sync signal 211 at its sync port 210. The sync signal 211 is received into the set 214 port of the flip flop 213. Once the sync signal 211 is received at the flip flop 213, the Q port 221 transition to a high state. Accordingly, the duration signal 225 transitions from a low to a high state. Accordingly, the sync signal is used to initiate the duration signal. At a known time delay after generating the sync signal, the launch controller launches a pulse onto the cable. In this way, the duration signal has already transitioned to high before the launch signal is even applied to the cable. However, since the delay is known, the effect of the time delay may be removed in subsequent processing. Adding this known time delay enables the launch circuit and associated counter circuit to eliminate the effects of any dead zone. More specifically, adding the known delay assures that the duration signal 225 will have a duration long enough to be accurately and confidently measured.

After the waiting the known delay time, the launch controller 206 provides a launch pulse. In one example, the launch pulse may be provided as a 5-volt pulse, but it will be appreciated that other waveforms and voltages could be used. The launch pulse signal is applied to the cable under test through connector 194. The signal passes through resistor 239. Resistor 239 is selected to have a resistance approximately equal to the impedance of the cable under test. For example, if the cable under test has an impedance of 100 Ohms, then resistor 239 will be selected to have a resistance of 100 Ohms. It will be appreciated that the resistor 239 may be adjustable under operator control to accommodate different types of cables. If the resistor 239 has been set at approximately the same impedance as the cable under test, then the resistor 239 and the impedance of the cable under test act as a voltage divider. Accordingly, when the launch signal 237 is applied, about half the voltage will initially appear on the return signal line 231 and at the comparator 227.

Provided the threshold 229 is set above one half the launch pulse voltage, the comparator 227 will not activate. For example, if the threshold 229 is set at 2.6 volts, then the 2.5 initial signal on the return signal 231 will not activate comparator 227. However, when the launch pulse travels down the cable, bounces off the end or disruption and returns to the launch circuit 200, the voltage on return signal 231 will increase. When the voltage increases beyond the threshold voltage 229, the comparator 227 will activate and provide a comparator signal 238. A comparator signal 238 is applied to the clock signal 218 of the flip flop 213. Since the D input 216 is grounded 215, when the comparator signal 238 is applied, the Q output 221 will also transition to a low state. Accordingly, the duration signal 225 will be brought to a low state when the return signal is received at the comparator 227 and causes the clock signal 218 to transition.

Figure 7:
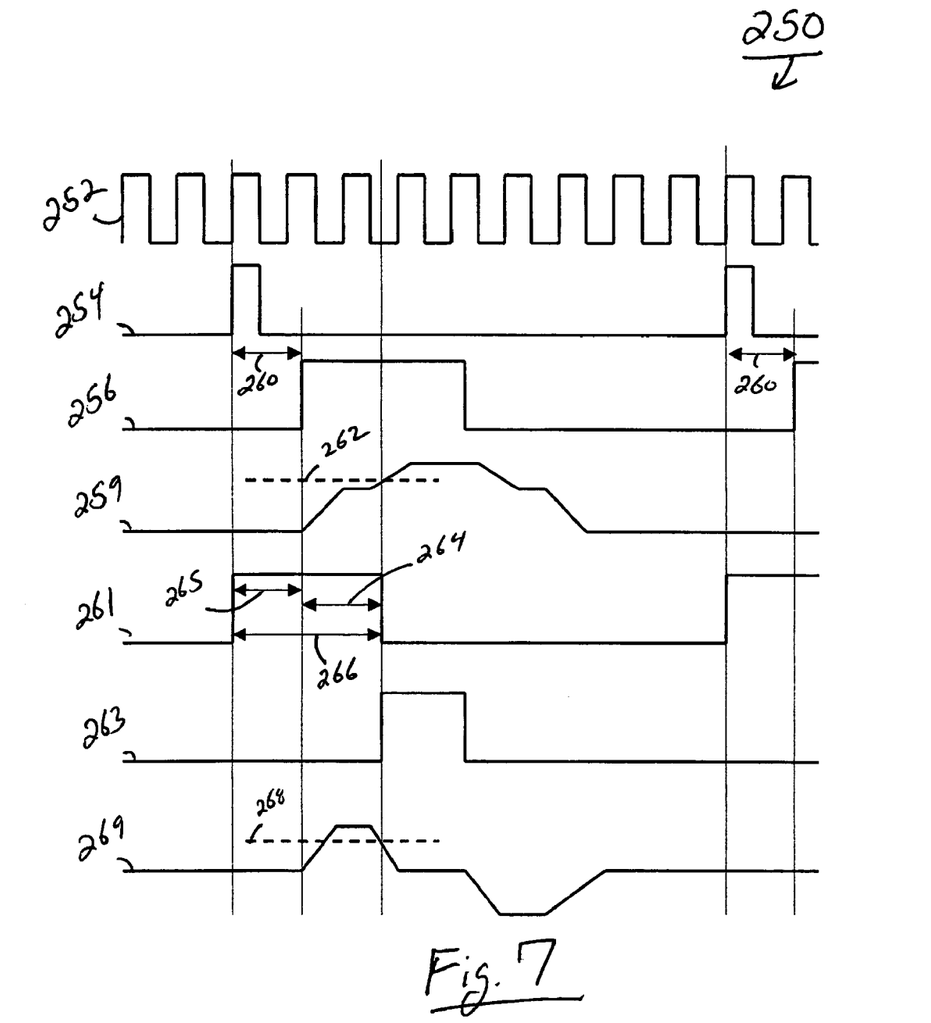
FIG. 7 is an illustration of launch circuit signals in accordance with the present invention.

Referring now to FIG. 7 signals 250 are shown. Signals 250 are useful in describing the functions and operation of a launch circuit similar to launch circuit 200. Signal 252 represents a reference signal similar to reference signal 204 described earlier. Reference signal 252 may operate, for example, at about 400 kHz, and should be unrelated to the frequency used for any measurement counter. Periodically, a sync signal 254 is provided for starting a duration signal. In one example, a sync signal is sent about every 40 microseconds to start a new measurement cycle. The sync signal 254 is similar to the sync signal 211 described earlier. As can be seen, the sync signal 254 causes the duration signal 261 to transition from low to high. The duration signal 261 is similar to duration signal 225 described earlier. After a known delay 260, a launch signal 256 is generated. The launch signal 256 is similar to launch signal 237 described earlier. The launch signal 256 is injected onto a cable under test and then turned off prior to the expected time of return. A return signal 259 is then generated responsive to at least part of the launch signal being returned. The return signal 259 is similar to return signal 231 described earlier. The return signal initially rises to a level approximately ½ the voltage of the launch signal. It will appreciate that this initial rise is dependent on the specific impedance of the cable and resistors selected for the device. A threshold 262 has been defined which is above the initial expected voltage on the return signal. When the launch signal returns, the voltage on the return signal 259 again rises. Once the voltage of the return signal 259 reaches and exceeds the threshold voltage, then it will be determined that the pulse signal has returned. At that point, the duration signal 261 transitions to a low state. More precisely, it is a comparator signal 263 that causes the transition in the duration signal 261. Comparator signal 263 is similar to comparator signal 238 described earlier. The duration signal 261 therefore has an overall signal duration 266 which has a duration that includes the known delay 265 and the duration due to the cable length 264. It will also be appreciated that the duration may have certain inaccuracies and durations due to the specific circuit and cable used. Accordingly, to determine the actual cable length, the known delay 262 must be compensated for. This compensation may be done on an individual measurement basis or may be performed on the accumulated aggregation of measurements.

The return signal 259 is indicative of an opened cable under test. If the cable under test is shorted, then a return signal will be generally in the form of return signal 269. A threshold signal 268 has been defined which is below the initial expected voltage on the return signal. When the launch signal returns, the voltage on the return signal 269 drops. Once the voltage of the return signal 269 reaches and falls below the threshold voltage, then it will provide an indication that the pulse signal has returned. The duration signal 261 then transitions to a low state, and the length to the short may be calculated as discussed in detail above. In this way, the length to either a short or an open in the cable may readily be determined Referring now to FIG. 8 a method for operating a launch circuit is described. Method 280 provides a reference signal 282. The method 280 also predefines a measurement threshold, where the measurement threshold is set to provide an indication that a signal has returned on the cable under test. The duration signal is turned on in step 284 and a known delay is applied in block 286. After waiting the known delay, a pulse is launched into the cable under test in block 288. When the return pulse reaches a threshold point, the return pulse 291 has been detected which indicates the end of the duration signal 293. The duration of the duration signal may then be measured 295. Since the duration signal includes the known delay, the known delay must be compensated for 297 before calculating the length of cable 299. Once the length of the cable is known, then the length of cable can be presented 301, for example, to an operator.

Figure 9:
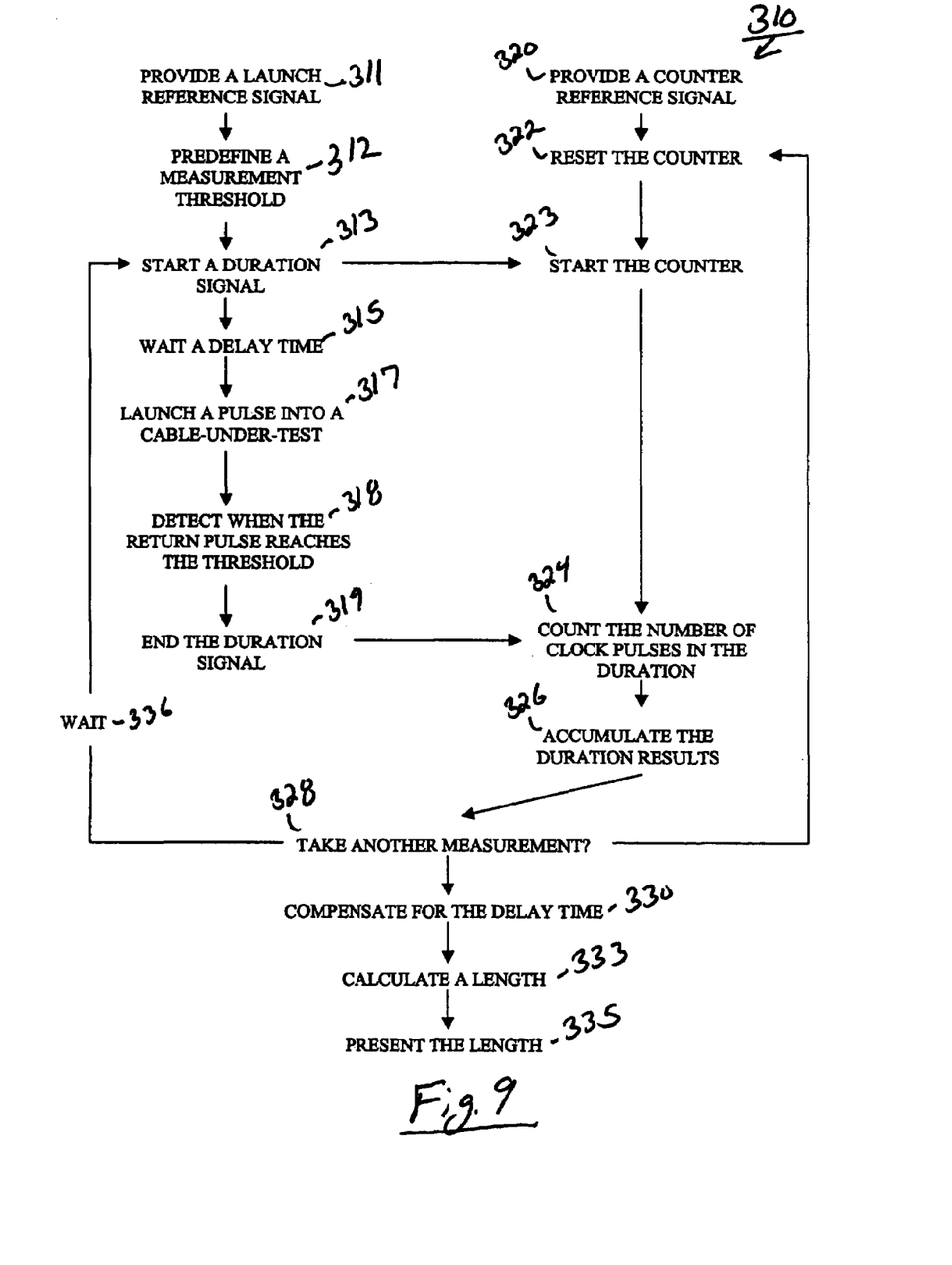
FIG. 9 is a flowchart of a method of time domain reflectometry in accordance with the present invention.

Referring now to FIG. 9 a method 310 or making a time domain reflectometer measurement is described. Method 310 includes the advancements in the enhanced resolution counter and the improved launch circuits described earlier. Method 310 provides a launch reference signal 311 and predefines a measurement threshold 312. The method also provides a counter reference signal 320, which should be unrelated to the launch reference signal set in block 311. A counter's also reset 322 prior to starting the first measurement. A duration signal is started 313 and after a knows delay time 315 a pulse is launched into a cable under test. When it is detected that the pulse has been returned to the reflectometer 318, the duration signal is ended 319. At some time after the start of the duration signal the counter may be started 323, and the counter used to count the number of counter reference singles received during the duration signal. Once the end duration signal 319 has been reached, this indicates that individual measurement cycle has been completed. At this point the results from that measurement may be accumulated 326 for later processing.

As described earlier it may be advantageous to take many, even thousands of measurements. Therefore it is likely that another measure may be taken 328. When another measurement is taken, the counter is reset 322, preparing the counter for the next measurement cycle. It also is likely that the system will have a short wait period 336 built in to assure that the device has time to complete the first measurement before the second measurement is started. The second measurement would start once the duration signal has started again 313. Once all the measurements have been taken then the accumulated results may be processed. For example, the additional known time delay needs to be compensated for 330, and a length of cable should be compensated for 333. It will also be appreciated that the processing may include compensating for known characteristics of the specific of the main reflectometer device. For example, a device may be characterized during a manufacturing test and these characteristics used to provide certain compensations during the processing time. Once a length has been calculated, the length can be presented 335.

Figure 10:
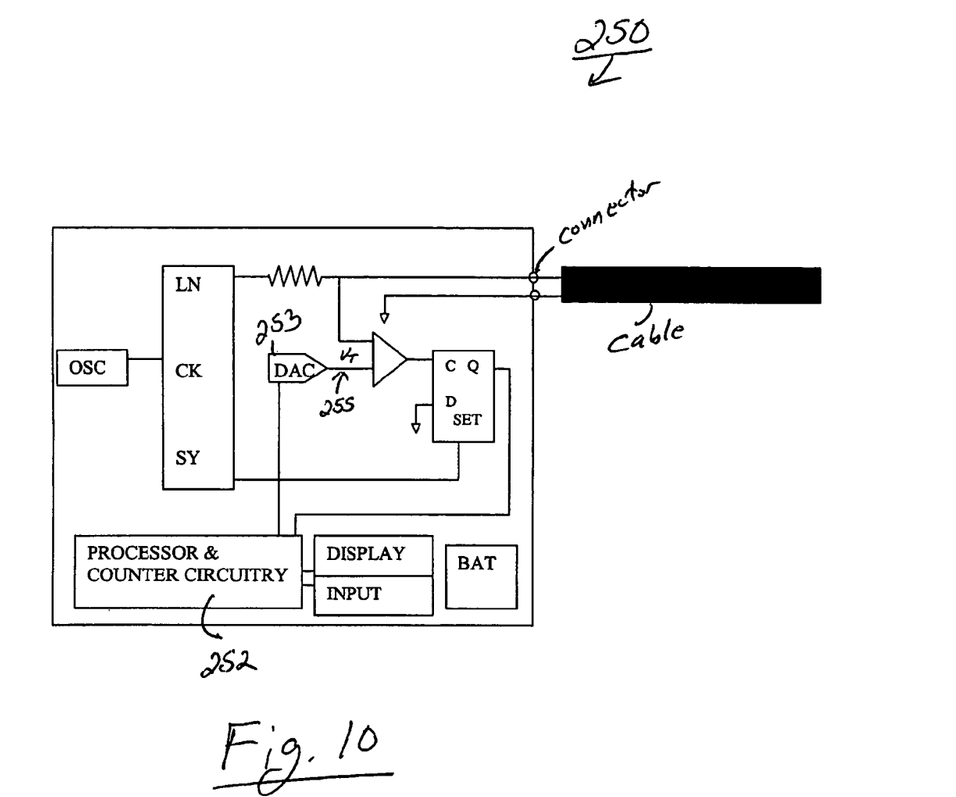
FIG. 10 is a block diagram of a launch assembly in accordance with the present invention.

Referring now to FIG. 10, and with reference to FIG. 7, a launch assemble is shown that implements a method for automatically setting a threshold voltage. As described with reference to FIG. 7, the threshold voltage 262 is set above the initial expected voltage of the return signal. Generally, it is expected that the return signal will initially rise to a level approximately one-half the voltage of the launch signal. The specific rise is dependant, among other factors, on the specific impedance of the cable under test and the resistors selected for the device. The characteristics of the cable under test and the cable's length determine the slope of the rise on the return signal. Generally, a longer cable will have a shallower slope than a shorter cable. For a shallower slope, a relatively small change in threshold voltage will result in a more significant change in duration. In this way, the selection of the threshold level will affect the accuracy of the length measurement. Accordingly, it may be desirable in some implementations to adjust the threshold setting to achieve an improved accuracy in the length measurement.

FIG. 10 shows one example of a launch assembly 250 for automatically setting and adapting the threshold voltage to obtain an improved measurement. Launch assemble 250 is similar to launch assembly 190, which has been fully described with reference to FIGS. 5, 6 and 7. Launch assemble 250 includes a processor or other control circuitry 252 which is coupled to a digital to analog converter (DAC) 253. The processor and the DAC cooperate to set and adapt the threshold voltage. A typical DAC will have 8 to 16 bits of resolution, and the output voltage span of the DAC is selected to be similar to the range expected for the return signal. It will be appreciated that the DAC may be implemented using a monolithic component or with discreet components depending on application specific performance and cost goals.

Generally, DAC 253 is set by the processor to output several voltage levels within the expected threshold range. At each voltage setting, duration measurements are taken and stored. By analyzing the duration results, it can be determined if the cable under test has a short condition or an open condition, and the inflection point of the return signal can be identified. Using this information, the voltage at the inflection point may be determined, and the inflection voltage may then be used as the measurement threshold voltage. The launch assembly, using the inflection voltage as the threshold, then determines the length to the open or short as previously described.

Figure 11:
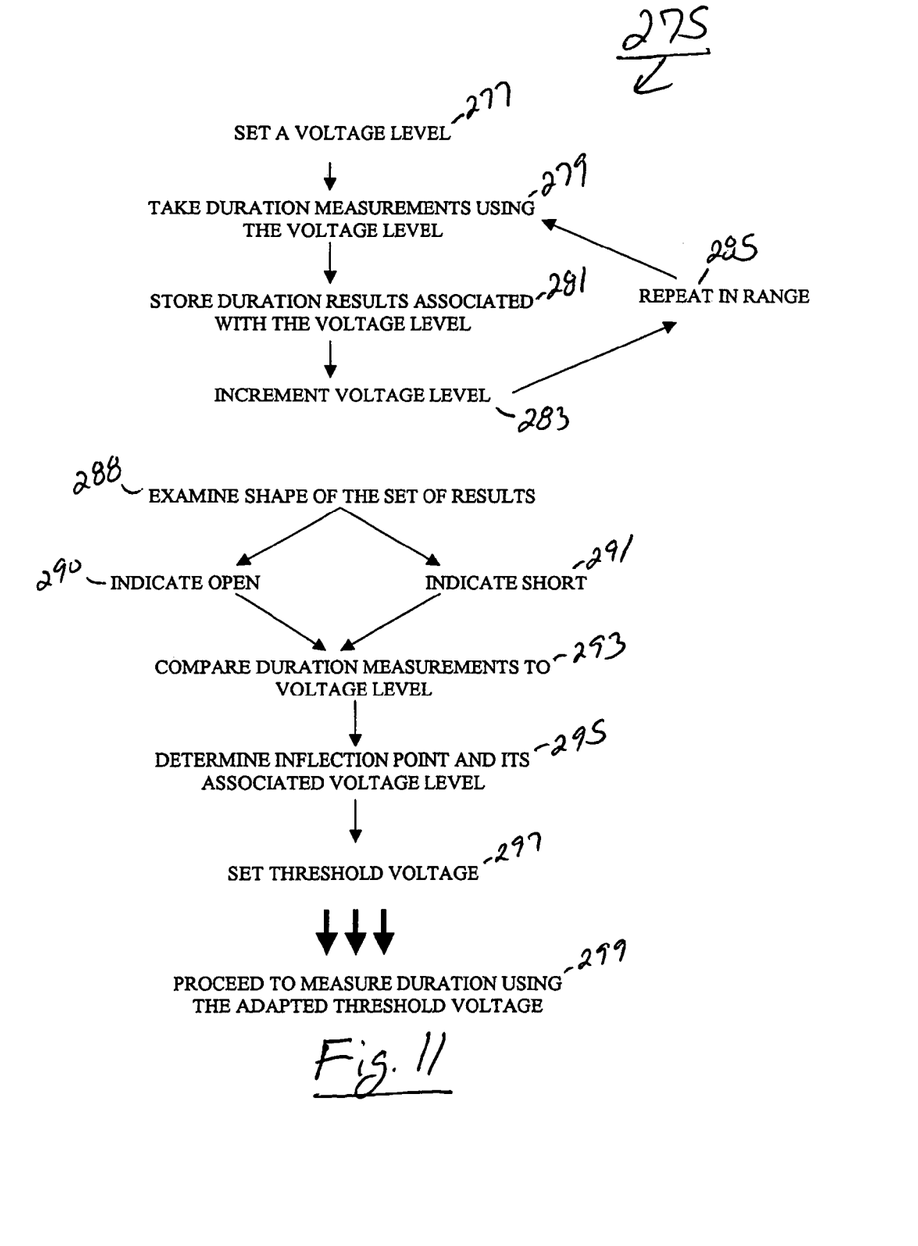
FIG. 11 is a flowchart of a method for setting and adapting a threshold voltage in accordance with the present invention.

It will be appreciated that the method described above may be implemented in alternative processes consistent with this disclosure. FIG. 11 shows one specific example of a method 275 for setting and adapting a threshold voltage. Method 275 starts by setting an initial voltage level 277 for the DAC. The DAC, which is under the control of the processor or other control circuitry, may be set initially at a relatively low level. For example, the initial voltage level may be set at 5% of the expected maximum threshold voltage. With the voltage set, several duration measurements are taken as shown in block 279. The number of duration measurements may be relatively small as compared to the duration process previously described. For example, about 400 measurements may be taken in step 279, whereas several thousand measurements may be taken for a final duration measurement. In block 281 the results from the duration measurement are stored, typically in a table. It will be appreciated that other measurement storage mechanisms may be used, such as a database or other file system. It will also be appreciated that the results may be stored in raw format or in a processed format. The processor or other control circuitry then controls the DAC to output a higher voltage level as shown in block 283. Process 275 continues to take duration measurements and store the results of the duration measurements at the new voltage level. The new voltage level may be, for example, an increase of 5% over the previous set voltage level. The incrementing, measuring, and storing process repeats as shown in block 285, until measurements have been taken in a full range of expected or possible threshold levels. This repetitive process results in a set of voltage levels with their associated duration measurements. In block 288, the table of results is examined and the shape of the set of results will indicate if the cable has an open condition as shown in block 290 or a short condition as shown in block 291. As more fully described as reference to FIG. 7, the shape of an open return signal and a short signal will be different, with the shape of the return signal being indicated in the set of results.

Once the process is aware of whether the cable has a short condition or an open condition, the process may continue to locate the inflection point, where the inflection point indicates the point where the signal has returned and the duration measurement should end. To determine the inflection point, the process 275 compares the duration measurements to the voltage levels stored in the set of results as shown in block 293. A derivative of the values is calculated, and used to determine the point of inflection. As will be appreciated, the derivative, which is indicative of slope, will have a readily discernable change at the point of inflection. Once the point of inflection has been found, the voltage point associated with the point of inflection may be determined as shown in block 295. This voltage level reflects an adaptation responsive to the current cable characteristics, and therefore is set as the new threshold value as shown in block 297.

Figure 8:
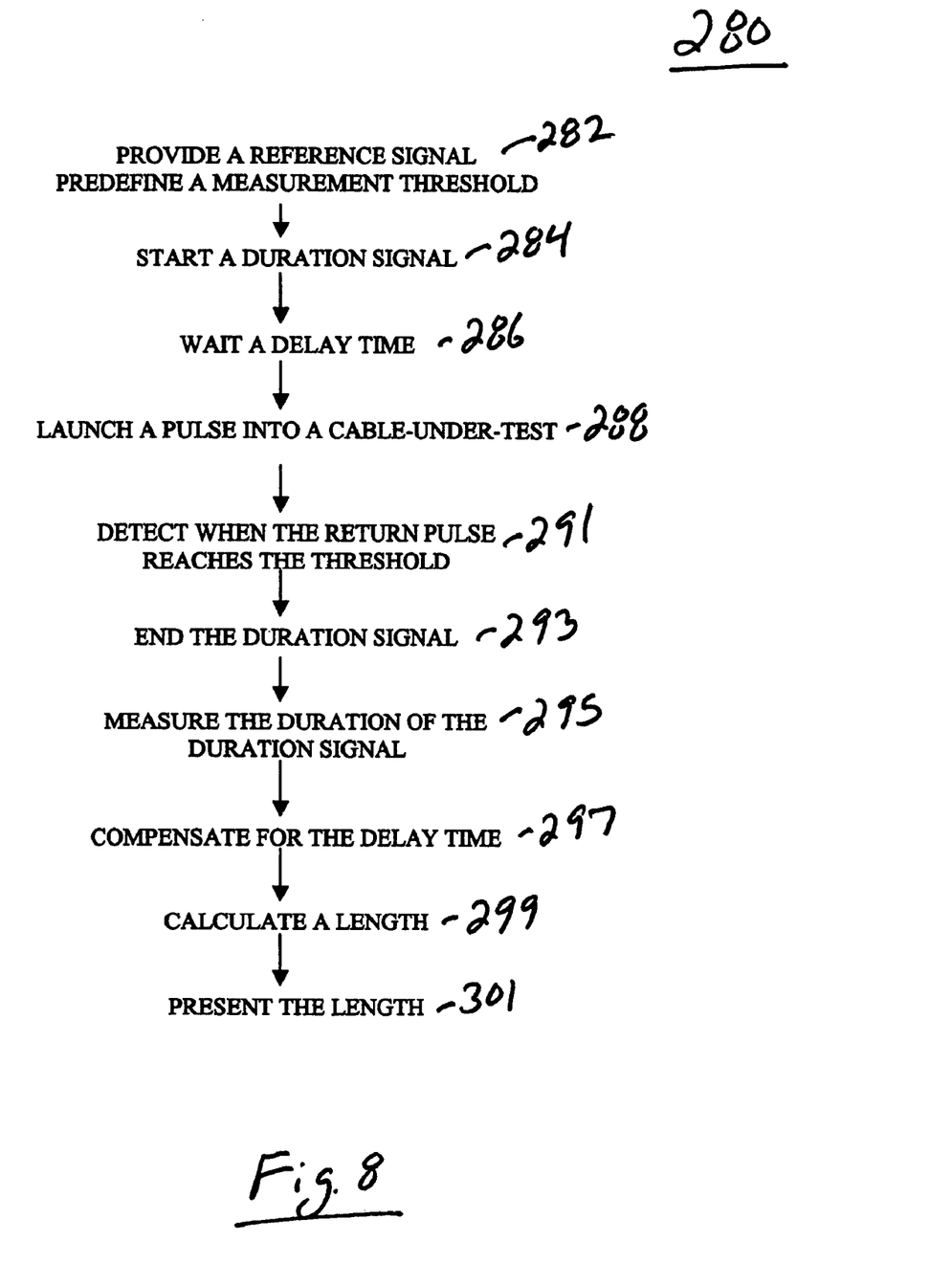
FIG. 8 is a flowchart of a method of reducing the effects of TDR dead zone in accordance with the present invention.

Method 275 continues by using the adapted threshold voltage as a threshold voltage for a complete measurement process, such as the measurement process described with reference to FIG. 8. Of course, it will be appreciated that the predefined measurement threshold of FIG. 8 would be replaced with the adaptive threshold as set in method 275. Using the adaptive threshold value, it is expected that the duration and length measurements will have increased accuracy.

While particular preferred and alternative embodiments of the present intention have been disclosed, it will be appreciated that many various modifications and extensions of the above described technology may be implemented using the teaching of this invention. All such modifications and extensions are intended to be included within the true spirit and scope of the appended claims.

What is claimed is:

1. A digital time domain reflectometer system, comprising:
   a launch controller periodically:
      generating a sync signal for transitioning a duration signal to an "on" state, the sync signal starting a counter;
      waiting a known delay time after generating the sync signal; and
      generating a launch signal responsive to the expiration of the known delay;
   a detection circuit:
      detecting that the launch signal has bounced back using an adapted threshold; and
      transitioning, responsive to detecting the bounced launch signal, the duration signal to an "off" state to stop the counter;
   an oscillator providing a clock signal having a time base that is unrelated to the timing of the launch signal;
   the counter for counting the number of clock signals received while the duration signal is in the "on" state; and
   a controller:
      compensating for the additional clock signals received on account of the known delay time; and
      calculating a cable length.

2. The digital time domain reflectometer system of claim 1, further including the steps of:
   adjusting a threshold voltage to a plurality of voltage levels;
   taking duration measurements at each voltage level;
   aggregating the duration measurements and generating a set of measurements;
   determining, using the set of measurements, a voltage level at an inflection point in the bounced launch signal; and
   using the determined voltage level as the adapted threshold value.

3. The digital time domain reflectometer system of claim 2, wherein the set of measurements is used to determine if the cable has an open condition or a short condition.

4. The digital time domain reflectometer system of claim 1, wherein the counter is constructed to have 12 or fewer bits.

5. The digital time domain reflectometer system of claim 1, wherein the counter is constructed to have 8 bits.

6. The digital time domain reflectometer system of claim 1, wherein the oscillator is constructed to provide a clock signal slower than about 50 MHz.

7. The digital time domain reflectometer system of claim 1, wherein the oscillator is constructed to provide a clock signal at about 10 MHz.

8. The digital time domain reflectometer system of claim 1, wherein the launch controller is constructed to generate the sync signal about every 40 micro seconds.

9. The digital time domain reflectometer system of claim 1, wherein the counter is constructed to count the number of clock signals received in each one of multiple signal durations; and the controller performs the additional step of aggregating the count results for the multiple counts.

10. The digital time domain reflectometer system of claim 1, wherein the counter is constructed to count the number of clock signals received in each one of thousands of signal durations; and the controller performs the additional step of aggregating the count results for the thousands of counts.

11. A method of calculating cable length, comprising:
providing a low frequency clock signal and an adapted threshold;
performing a measurement cycle, comprising:
starting a duration measurement responsive to the low frequency clock signal;
waiting a known delay time after starting the duration measurement;
providing a duration signal having a duration indicative of the cable length, the duration signal being turned off responsive to comparing the adapted threshold to a bounced signal;
counting the number of clock pulses received during the duration that the duration signal is on using a clock that is independent from the low frequency clock signal;
repeating the measurement cycle more than about 1000 times;
averaging the results from the measurement cycles; and
calculating, using the average results, a cable length.

12. The method according to claim 11 further including repeating the measurement cycle about 25 thousand times.

13. The method according to claim 11 wherein the counting step includes counting from 0 to a maximum of 255.

14. The method according to claim 11 wherein the counting step includes counting using a Gray code.

15. The method according to claim 11 wherein the counting step includes counting using a modified Gray code, the modified Grey code allowing a maximum two-bit transition.

16. The method according to claim 11, further including setting the adaptive threshold by:
setting a threshold to a first threshold value, performing several measurement cycles using the threshold, and storing the measurement result in a set;
incrementing the threshold to a next threshold value, performing several measurement cycles using the threshold, and storing the measurement result in the set;
repeating the incrementing step through a range of threshold values; and
using the set of measurement results to set the value for the adapted threshold.

17. The method according to claim 16, further including the step of setting the adaptive threshold by finding an inflection point in the set of measurements.

18. The method according to claim 16, further including the step of setting the adaptive threshold by using the set of measurements to determine if the cable has a short condition or an open condition.

19. A method of reducing the effects of dead zone in a time domain reflectometer, comprising:
turning a duration signal to an "on" state using a first clock;
waiting a known delay time after turning on the duration signal;
launching a launch signal on to a cable after the known delay time;
detecting a bounced signal;
transitioning the duration signal to an "off" state using an adapted threshold;
measuring the duration that the duration signal was in the "on" state using a clock that is unrelated to the first clock;
a counter for counting the number of clock signals received while the duration signal is in the "on" state compensating the duration signal for the known delay time; and
calculating a length using the compensated duration signal.

* * * * *